United States Patent [19]

Wang

[11] Patent Number: 5,366,770

[45] Date of Patent: Nov. 22, 1994

[54] AEROSOL-PLASMA DEPOSITION OF FILMS FOR ELECTRONIC CELLS

[76] Inventor: Xingwu Wang, 113 N. Main St., Alfred, N.Y. 14802

[21] Appl. No.: 120,581

[22] Filed: Sep. 13, 1993

Related U.S. Application Data

[63] Continuation-in-part of Ser. No. 871,278, Apr. 20, 1992, Pat. No. 5,260,105, which is a continuation-in-part of Ser. No. 510,011, Apr. 17, 1990, Pat. No. 5,120,703.

[51] Int. Cl.$^5$ .................. B05D 3/06; B05D 3/02
[52] U.S. Cl. .................. 505/477; 427/565; 427/569; 427/600; 427/226; 427/419.1; 427/421; 427/62; 427/576; 429/30; 505/704; 505/702
[58] Field of Search ............. 427/576, 565, 600, 533, 427/535, 62, 419.1, 419.2, 421, 226; 505/1, 701, 702, 704; 429/30

[56] References Cited

U.S. PATENT DOCUMENTS

| | | | |
|---|---|---|---|
| 4,831,965 | 5/1989 | Brian et al. | 118/725 |
| 5,032,568 | 7/1991 | Lau et al. | 505/1 |
| 5,120,703 | 6/1992 | Snyder et al. | 505/1 |
| 5,260,105 | 11/1993 | Wang | 427/576 |

Primary Examiner—Roy V. King
Attorney, Agent, or Firm—Howard J. Greenwald

[57] ABSTRACT

An atmospheric process for the production of a coating of film upon a nickel-containing substrate. In the first step of this process, an aerosol mist containing reactants necessary to form the coating is provided. Thereafter, the mist is subjected to radio-frequency radiation while in the plasma region. Thereafter, the vaporized mixture is then deposited onto a nickel substrate. In subsequent steps, one or more other layers of vaporized material may be deposited onto the coated substrate.

10 Claims, 2 Drawing Sheets

AEROSOL-PLASMA DEPOSITION OF FILMS FOR ELECTRONIC CELLS

CROSS-REFERENCE TO RELATED PATENT APPLICATIONS

This is a continuation in part of applicant's copending U.S. patent application Ser. No. 07/871,278, filed Apr. 20, 1992, now U.S. Pat. No. 5,260,105 which in turn was a continuation-in-part of U.S. patent application Ser. No. 07/510,011, filed on Apr. 17, 1990.

FIELD OF THE INVENTION

An atmospheric process, using deposition of plasma vapor, for coating a nickel substrate with yttria-stabilized zirconia to prepare a buffered material which may thereafter be coated with the 1-2-3 yttrium-barium-copper superconductive material.

BACKGROUND OF THE INVENTION

A substantial amount of work has been done in the development of ceramic superconductor composite wires. As is disclosed in an article by Gil N. Riley, Jr. et. al. entitled "Commercialization of Ceramic Superconductor Composite Wires" (American Ceramic Society Bulletin, Volume 72, No. 7, July, 1993, at pages 91–97), "Recent advances in the development of high-temperature superconductor... composite wires demonstrate an increasingly realistic potential for commercial applications, such as power transmission cables, motors, and superconducting magnetic energy storage ... systems."

As is disclosed in the Riley article, the most promising superconductive composite wire contains a core consisting of the bismuth-strontium-calcium-copper superconductive material and a silver sheath. This wire, however, only operates satisfactorily at temperatures below about 20 degrees Kelvin.

The well-known 1-2-3 yttrium-barium-copper superconductive phase has a phase transition temperature of about 93 degrees Kelvin; and, if it were known how to make a sheath—core fiber from it, such fiber would operate satisfactorily at a temperature above 77 degrees Kelvin.

The conventional means of producing ceramic superconductor composite wires is to charge the precursor powders of the superconductive material into a silver tube, deform the filled tube into a wire of desired diameter, and then fire the filled tube to convert the powder into the desired superconductor. See, e.g., the Master's thesis of Barton C. Prorok entitled "Formation of the $Bi_2Sr_2Ca_2Cu_3O_x$ Superconductor by a Two Powder Process" which available from the University of Illinois at Chicago (1993).

Because of the relatively low melting point of silver, (962 degrees centigrade), and the relatively high temperature necessary to sinter the 1-2-3 phase (about 960 degrees centigrade), it has heretofore been very difficult to produce the silver/1-2-3 sheath/core wire.

Not every metal can be used as a sheath for superconductive wire. Although silver ion does not effect the activity of the 1-2-3 phase, other metals tend to destroy such activity. Thus, when nickel is substituted for silver as the sheath material and the nickel/1-2-3 precursor assembly is fired, nickel ion replaces the copper in the 1-2-3 structure and destroys its superconductivity. See, e.g., an article by H. M. Meyer et. al. entitled "Ni/$YBa_2Cu_3O_{7-x}$... formation ..." appearing in the Journal of Material Research, Volume 6, No. 2, February, 1991, pages 270–277.

It is an object of this invention to provide a plasma process for preparing a ceramic superconductor composite wire which will be superconductive at temperatures in excess of 77 degrees Kelvin and which, additionally, may be used for large scale, economical production of the composite wire.

It is another object of this invention to prepare an intermediate which, after firing, may be formed into a ceramic superconductor composite wire.

SUMMARY OF THE INVENTION

In accordance with this invention, there is provided an atmospheric process for the production of a coating or film. In the first step of this process, an aerosol mist containing reactants necessary to form the coating is provided. Thereafter, the mist is subjected to radio-frequency radiation while in the plasma region. Thereafter, the vaporized mixture is then deposited onto a nickel substrate. In subsequent steps, one or more other layers of vaporized material may be deposited onto the coated substrate.

BRIEF DESCRIPTION OF THE DRAWINGS

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
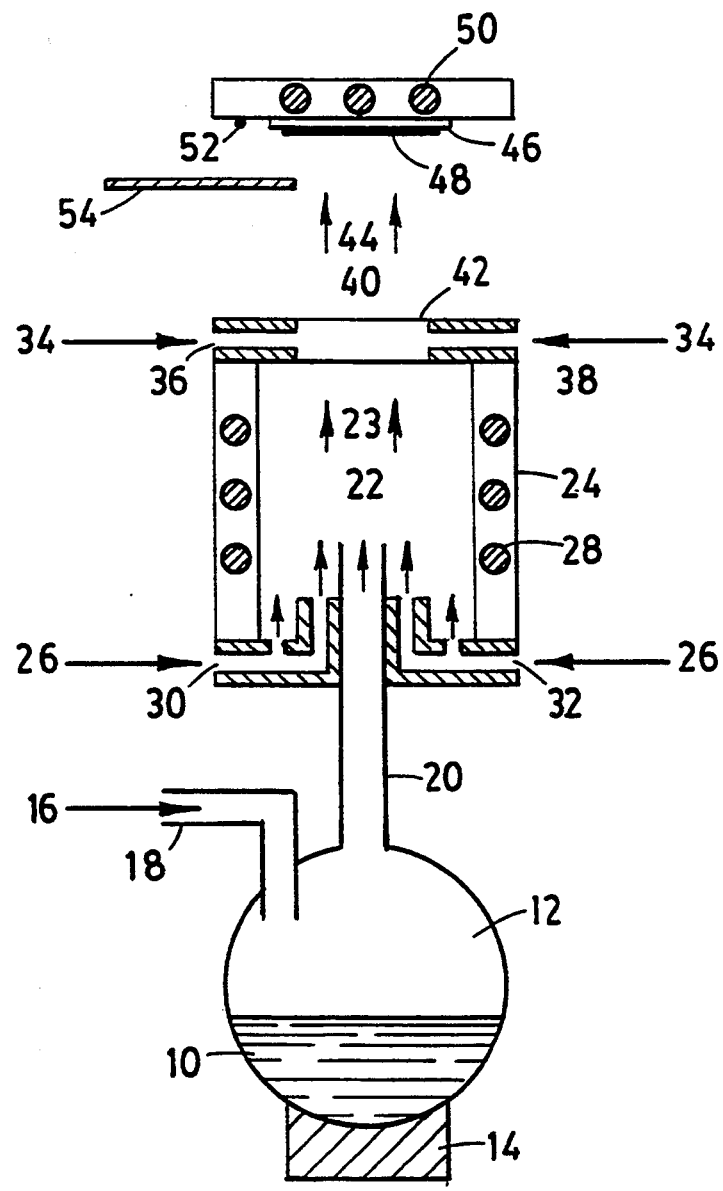
FIG. 1 is a system diagram illustrating one preferred embodiment of the process of this invention.

FIG. 1 illustrates a preferred embodiment of applicants' process. In the first step of the process, a solution 10 of reagents is charged into misting chamber 12.

The reagents charged into misting chamber 12 will be sufficient to form a layer of the desired material in the process. The nature and identity of these reagents will be discussed later in this specification after the general process is discussed.

Referring again to FIG. 1, the solution 10 in misting chamber 12 is preferably caused to form into an aerosol, such as a mist.

The term aerosol, as used in this specification, refers to a suspension of ultramicroscopic solid or liquid particles in air or gas, such as smoke, fog, or mist. See, e.g., page 15 of "A dictionary of mining, mineral, and related terms," edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer, publication A-850-C (published by DeVilbiss, Somerset, Pa, 1989), the disclosure of which is hereby incorporated by reference into this specification.

In the embodiment shown in FIG. 1, the oscillators of ultrasonic nebulizer 14 are shown contacting an exterior surface of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et. al., "Plasma Deposited Thin Films" (CRC Press Inc., Boca Raton, Fla., 1986); "Methods of Experimental Physics," Volume 9—Parts A and B, Plasma Physics (Academic Press, N.Y., 1970/1971); N. H. Burlingame, "Glow Discharge Nitriding of Oxides," Ph.D. thesis (Alfred University, Alfred, N.Y., 1985), available from University Microfilm International, Ann Arbor, Mich. Each of these publications is hereby incorporated by reference into this specification.

In one preferred embodiment, the plasma reactor 24 was "model 56 torch" available from the TAFA Inc. of Concord, N.H. It was operated at a frequency of about 4 mega hertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, New York, 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor at a flow rate of from about 5 to about 30 liters per minute.

When a mixture of oxgyen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the material.

Radio frequency energy is applied to the reagents in the plasma reactor 24, and it causes vaporization of the mist.

In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which manufactured by Lepel Company (a division of TAFA Inc.) and which generates an alternating current with a frequency of 4 megahertz at a power input of 30 kilowatts. Thus, e.g.,. one may use an induction coil driven at 2.5-5.0 megahertz which is sold as the "PLASMOC 2" by ENI Power Systems, Inc. of Rochester, N.Y.

The use of these type of radio-frequency generators is described in the Ph.D. theses entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et. seq. of said McPherson thesis.

The vapor 44 present in flame region 40 is propelled upward towards substrate 46, which preferably consists essentially of either a refractory metal and/or a refractory alloy with a melting point in excess of 1,100 degrees centigrade.

Those skilled in the art are well aware of those metals and alloys that have melting points in excess of 1,100 degrees centigrade; see, e.g., pages 23-38 to 23-53 of Robert H. Perry et. als. "Chemical Engineers' Handbook, Fifth Edition (McGraw-Hill Book Company, New York, 1973). Thus, by way of illustration and not limitation, suitable materials include nickel, molybdenum, tungsten, Hastelloy Alloy B, Incoloy Alloy 800, Nimonic 75, Inconel 600, Monel Alloy 400, and the like.

In one preferred embodiment, the substrate contains at least about 40 mole percent of nickel, present either by itself, in mixture, or in an alloy with one or more other elements (such as chromium, molybdenum, tungsten, and the like). It is preferred that the substrate contain at least about 50 mole percent of nickel.

In one embodiment, the substrate used is Hastelloy Alloy B, which contains at least about 66 mole percent of nickel, about 28 mole percent of molybdenum, about 5 mole percent of iron, and trace amounts of manganese and silicon.

In another embodiment, the substrate used is Hastelloy Alloy C, which contains at least about 58 mole percent of nickel, about 16 mole percent of molybdenum, about 16 mole percent of chromium, about 5 mole percent of iron, about 4 mole percent of tungsten, and trace amounts of manganese and silicon.

In another embodiment, the substrate used is Hastelloy Alloy D, which contains about 86 mole percent of nickel, about 10 mole percent of silicon, and, about 3 mole percent of copper, and trace amounts of manganese.

In another embodiment, the substrate used is Hastelloy Alloy G, which contains about 44 mole percent of nickel, about 22 mole percent of chromium, about 20 mole percent of iron, about 6.5 mole percent of molybdenum, and minor amounts of tantalum, copper, carbon, and tungsten.

In another embodiment, the substrate used is Hastelloy Alloy X which contains about 48 mole percent of nickel, about 22.0 mole percent of chromium, about 18.5 mole percent of iron, about 9.0 mole percent of molybdenum, and minor amounts of cobalt, tungsten, and carbon.

In another embodiment, pure nickel is used.

In addition to containing from about 40 to about 100 mole percent of nickel and having a melting point in excess of 1,100 degrees centigrade, the substrate preferably will have a tensile strength of at least about 50,000 pounds per square inch and a tensile modulus of elasticity of at least about 20,000,000 pounds per square inch.

In one preferred embodiment, a film of yttria-stabilized zirconia is first coated onto the nickel-containing substrate to form a buffered substrate and, thereafter, a film of the 1-2-3- material is then coated onto the buffered substrate. An electronic cell, which is discussed in FIG. 2, is thereby formed.

Figure 2:
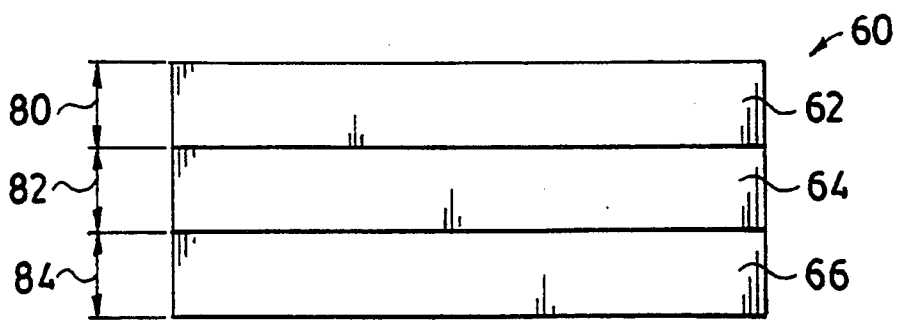
FIG. 2 is a cross-sectional representation of a typical electronic cell unit.

Referring to FIG. 2, it will be seen that electronic cell 60 is comprised of superconductive layer 62, buffer layer 64, and substrate 66.

The superconductive layer 62 of electronic cell 60 consists essentially of a material of the formula $RBa_2Cu_3O_{6=x}$, wherein x is from about 0.5 to about 1.0 and R is a rare earth element selected from the group consisting of yttrium, gadolinium, lanthanum, europium, and holmium, it being preferred that R is yttrium. See, e.g., U.S. Pat. No. 4,960,760, the entire disclosure of which is hereby incorporated by reference into this specification.

It is preferred that superconductive film 62 have a thickness 80 of from about 0.1 microns to about 5 millimeters and, preferably, have a thickness 80 of from about 0.5 to about 1.0 millimeters.

In one preferred embodiment, buffer layer 64 consists essentially of stabilized zirconia which may be, e.g., yttria or calcia-stabilized zirconia. These materials are well known to those skilled in the art and are described, e.g., in U.S. Pat. Nos. 4,831,965, 4,937,152, 4,950,562, and 4,971,830, the disclosure of each of which is hereby incorporated by reference into this specification.

In another embodiment, buffer 64 may be bismuth oxide stabilized zirconia, or a zirconia stabilized with both bismuth (25 percent), calcia (2 percent), and yttria. These materials are discussed in the "Annual Technical Progress Report" for the period from December, 1987 to December, 1988 which is entitled "Development of Planar Geometry Solid Oxide Fuel Cells" and which is published by the Gas Research Institute of Chicago, Ill.

The material in buffer 64 may have the perovskite structure.

Referring again to FIG. 2, it will be seen that buffer 64 preferably has a thickness 82 of at least about 0.001 microns and, preferably, from about 0.005 to about 0.2 microns. In one especially preferred embodiment, the thickness of buffer 64 is from about 0.05 to about 0.1 microns.

In general, the thickness 84 of substrate 66 is typically at least about 0.1 millimeters and often ranges from about 0.1 to about 5 millimeters.

Figure 3:
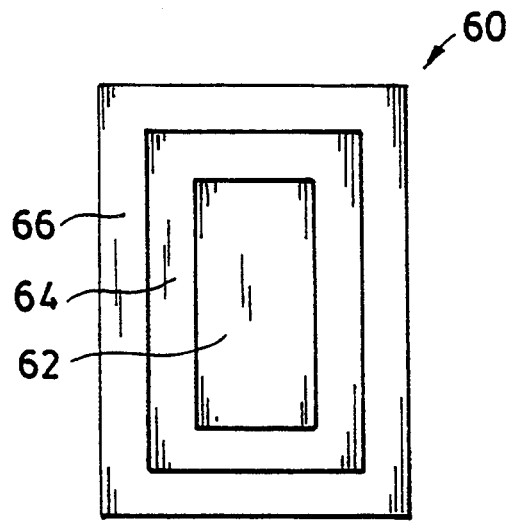
FIG. 3 is a top view of the electronic cell unit of FIG. 2; and unit cells in series.
Figure 4:
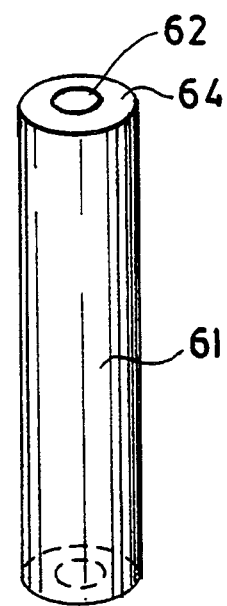
FIG. 4 is a schematic representation of a ceramic superconductor composite wire made from the cell unit of FIG. 2.

FIG. 3 is a top view of electronic cell 60. Referring to FIG. 3, it will be seen electronic cell unit 60 may first be formed as a substantially flat sheet (see FIG. 3) and then rolled into a tubular shape to form tube 61 (see FIG. 4). Because the nickel or nickel-containing substrate is ductile, it may readily be rolled into a tubular shape which it will keep before, during, and after subsequent firing; and, thus, it is not necessary (but it is possible) to solder or otherwise take measures to keep the tube 61 in tubular form.

After tube 61 has been formed, the tube 61 assembly (which contains the 1-2-3 material) is fired by subjecting it to a temperature of from about 900 to about 1,000 degrees centigrade for at least about 30 minutes and, more preferably, at least about 60 minutes, until the 1-2-3 material becomes superconductive wire. The firing of this assembly may be conducted in accordance with the firing schedule disclosed at columns 6-7 of U.S. Pat. No. 4,960,760, the entire disclosure of which is hereby incorporated by reference into this specification.

In general, it is preferred to conduct such firing while contacting the wire with oxygen-containing gas.

In the process of this invention, it is preferred to form the structures of FIGS. 2 and/or 3 by sequentially applying a coating upon a substrate to first form a coated substrate, and thereafter applying one or more additional coatings on such substrate.

When preparing an electronic cell, it is preferred to "stack" the multilayers of the cell by working from the bottom up.

One advantage of applicant's process is that the substrate may be of substantially any size or shape, and it may be stationary or movable. Because of the speed of the coating process, the substrate 46 may be moved across the aperture 42 and have any or all of its surface be coated with the film 48.

The substrate may be at ambient temperature. Alternatively, one may use additional heating means to heat the substrate prior to, during, or after deposition of the coating.

In one preferred embodiment, heater 50 is used to heat the substrate to a temperature of from about 100 to about 800 degrees centigrade.

Temperature sensing means 52 may be used to sense the temperature of the substrate and, by feedback means (not shown) adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to substrate 46. The use of this shutter 54 is important prior to the time the flame region has become stable; and the vapor should not be allowed to impinge upon the substrate prior to such time.

The substrate 46 may be moved in a plane which is substantially parallel to the top of plasma chamber 24. Alternatively, or additionally, it may be moved in a plane which is substantially perpendicular to the top of plasma chamber 24. In one embodiment, the substrate 46 is moved stepwise along a predetermined path to coat the substrate only at certain predetermined areas.

In one embodiment, rotary substrate motion is utilized to expose as much of the surface of a complex-shaped article to the coating. This rotary substrate motion may be effected by conventional means. See, e.g., "Physical Vapor Deposition," edited by Russel J. Hill (Temescal Division of The BOC Group, Inc., Berkeley, Calif., 1986), the disclosure of which is hereby incorporated by reference into this specification.

The process of this invention allows one to coat an article at a deposition rate of from about 0.01 to about 10 microns per minute and, preferably, from about 0.1 to about 1.0 microns per minute, with a substrate with an exposed surface of 35 square centimeters. One may determine the thickness of the film coated upon said reference substrate material (with an exposed surface of 35 square centimeters) by means well known to those skilled in the art.

The film thickness can be monitored in situ, while the vapor is being deposited onto the substrate. Thus, by way of illustration, one may use an IC-6000 thin film thickness monitor (as referred to as "deposition controller") manufactured by Leybold Inficon Inc. of East Syracuse, N.Y.

The deposit formed on the substrate may be measured after the deposition by standard profilemetry techniques. Thus, e.g., one may use a DEKTAK Surface Profiler, model number 900051 (available from Sloan Technology Corporation, Santa Barbara, Calif.)

In one embodiment, the as-deposited film layer produced by the process of this invention consists of uniform, small grains. The term "as-deposited" refers to the film prior to the time it is subjected to post-annealing.

In this preferred embodiment, at least about 80 volume percent of the particles in the as-deposited film are smaller than about 1 microns. It is preferred that, in this embodiment, at least about 90 percent of such particles are smaller than 1 micron. Because of this fine grain size, the surface of the film layer is relatively smooth.

In one preferred embodiment, the as-deposited film is post-annealed.

Applicant's process provides a substantial amount of flexibility in varying the porosity of the film deposited. By varying such factors as the concentration of solution 10 (a higher concentration produces a larger particle size), and/or the pressure of carrier gas 16 (the higher the pressure of gas 16, the faster the deposition rate, and the higher the porosity of the coated article), the temperature of the substrate (the higher the substrate temperature, the larger the size of the grains deposited), the radio-frequency energy used (the higher the energy, the larger the grain size deposited), energy supplied by the ultrasonic nebulizer (the greater the energy, the faster the deposition rate), and the like, one may control the porosity of the material deposited onto the substrate.

It is preferred that the generation of the vapor in plasma rector 24 be conducted under substantially atmospheric pressure conditions. As used in this specification, the term "substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms," supra.

The process of this invention may be used to produce coatings on a flexible nickel-containing substrate. One may deposit the coating directly onto such a strip. Alternatively, one may first deposit one or more buffer layers onto the strip(s).

The deposition of buffer layers between a substrate and a coating is well known to those skilled in the art. See, e.g., (1)H. S. Kwok et. al., "Laser evaporation deposition of superconducting and dielectric thin films," Applied Physics Letters, Volume 52 (21), May 23, 1988; (2)S. Witanachchi et al., "Laser Deposition of Superconducting and Semiconducting Thin Films," in "Superconductivity and its Applications," edited by H. S. Kwok et. al. (Elsevier Company, New York, 1988), at pages 194 et. seq. The disclosure of each of these publications is hereby incorporated by reference into this specification.

Referring again to FIG. 1, the solution 10 will preferably contain ions in substantially the stoichiometric ratio needed to form the desired coating. These ions are preferably available in solution 10 in water-soluble form, such as, e.g., in the form of water-soluble salts. Thus, e.g., one may use the nitrates or the chlorides or the sulfates or the phosphates of the cations. Other anions which form soluble salts with the cation(s) also may be used.

Alternatively, one may use salts soluble in solvents other than water. Some of these other solvents which may be used to prepare the material include nitric acid, hydrochloric acid, phosphoric acid, sulfuric acid, and the like. As is well known to those skilled in the art, many other suitable solvents may be used; see, e.g., J. A. Riddick et. al., "Organic Solvents, Techniques of Chemistry," Volume II, 3rd edition (Wiley-Interscience, New York, N.Y., 1970), the disclosure of which is hereby incorporated by reference into this specification.

In one preferred embodiment, where a solvent other than water is used, each of the cations is present in the form of one or more its oxides. For example, one may dissolve nickel oxide in nitric acid, thereby forming a nitrate. For example, one may dissolve zinc oxide in sulfuric acid, thereby forming a sulfate. One may dissolve nickel oxide in hydrochloric acid, thereby forming a chloride. Other means of providing the desired cation(s) will be readily apparent to those skilled in the art.

In general, as long as the desired cation(s) are present in the solution, it does not matter that much how it was obtained.

In general, one may use commercially available reagent grade materials. Thus, by way of illustration and not limitation, one may use the following reagents available in the 1988–1989 Aldrich catalog (Aldrich Chemical Company, Inc., Milwaukee, Wis.): yttrium chloride (catalog number 29,826-3), yttrium nitrate tetrahydrate (catalog number 21,723-9), yttrium sulfate octahydrate (catalog number 20,493-5), zirconium nitrate (reagent number 25,734-6), zirconium sulfate hydrate (reagent number 20,500-1), zirconyl chloride hydrate (reagent number 20,502-8), zirconyl nitrate hydrate (reagent number 24,349-3), and the like.

As long as the metals present in the desired buffer and/or superconductive material are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

In one preferred embodiment, aqueous solutions of yttrium nitrate, and zirconium nitrate with purities of at least 99.9 percent are mixed in the molar ratio of from about 0.08/1 to about 0.1/1 and then dissolved in distilled water to form a solution with a concentration of 150 grams per liter.

In one preferred embodiment, aqueous solutions of calcium nitrate, and zirconium nitrate with purities of at least 99.9 percent are mixed in the molar ratio of from about 0.08/t to about 0.1/1 and then dissolved in distilled water to form a solution with a concentration of 150 grams per liter.

These examples will illustrate to those skilled in the art how to form solutions of the required cations in stoichiometric ratios so that the vapor produced from solution 10 will deposit a coating with the desired composition.

The following examples are presented to illustrate the claimed invention but are not to be deemed limitative thereof. Unless otherwise specified, all parts are by weight and all temperatures are in degrees centigrade.

EXAMPLE 1

11.96 grams of yttrium nitrate hexahydrate and 38.232 grams of zirconyl nitrate hydrate were mixed with a sufficient amount of distilled water to make up a 200 gram/liter solution. The solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 watts and a frequency of 1.63 megahertz; the misting droplets formed were from about 0.5 to about 5.0 microns diameter in size. The gas inlet of the chamber was connected to a source of argon flowing at a rate of approximately 100 milliliters per minute.

The output from the misting chamber was connected to the TAFA plasma reactor equipped with the Lepel radio frequency frequency generator, both of which are described in the specification. The Lepel radio frequency generator was operated at a power of 30 kilowatts and produced an alternating current of 4 megahertz. Argon gas was introduced into the bottom portion of the plasma reactor; the argon flow rate was 30 liters per minute.

The distance between the top of the plasma reactor and the substrate was 11 centimeters. In this example, the substrate used was a foil, which was approximately 1 millimeter in thickness, which had a substantially square shape, and which was about 2.0 centimeters by about 2.0 centimeters. The foil consisted of a nickel-chromium alloy which contained 80 weight percent of nickel and 20 weight percent of chromium.

The vapor from the plasma reactor was deposited onto a foil substrate. A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

EXAMPLE 2

The procedure of Example 1 was substantially repeated, with the exception that the solution was different. 11.31 grams of zirconyl nitrate hydratge were mixed with 0.602 grams of yttrium oxide powder, and a sufficient amount of distilled water together with ten drops of nitric acid were added to the mixture to make up a solution with a concentration of 20 grams per liter.

A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

Thus, for example, the plasma deposition of the 1-2-3-material may be conducted in accordance with the procedure of U.S. Pat. No. 5,120,703, the entire disclosure of which is hereby incorporated by reference into this specification.

In one embodiment of applicant's invention, the process of the invention may be used to coat alumina or zirconia onto one or more of the surfaces of a concrete substrate in order to improve the mechanical and thermal properties of such substrate.

Thus, by way of illustration, in one embodiment the relative position of the substrate and the plasma reactor may be reversed. In the preferred embodiment illustrated in FIG. 1, the substrate is disposed above the plasma reactor. In another embodiment, not shown, the substrate may be disposed below the plasma reactor and the coating material may flow downwardly.

Thus, by way further illustration, and referring to FIG. 1, plasma reactor 24 may be tilted, reversed, or otherwise differently disposed than shown in such Figure without adversely affecting applicant's process.

I claim:

1. A process for coating a first layer of material and a second layer of material onto a nickel-containing substrate, comprising the steps of:
    (a) providing a first solution comprised of a first compound selected from the group consisting of an yttrium compound, a calcium compound, and admixtures thereof, and a second zirconium compound, wherein said first compound and said second zirconium compound are present in said solution at a concentration of from about 0.01 to about 1,000 grams per liter;
    (b) subjecting said first solution to ultrasonic sound waves at a frequency in excess of 20,000 hertz, and to a substantially atmospheric pressure of at least about 600 millimeters of mercury, thereby causing said solution to form into a first aerosol;
    (c) providing a radio frequency plasma reactor;
    (d) generating a plasma gas within said radio frequency plasma reactor;
    (e) contacting said first aerosol with said plasma gas within said plasma reactor while subjecting said first aerosol to a substantially atmospheric pressure of at least about 600 millimeters of mercury and to a radio frequency alternating current at a frequency of from about 100 kilohertz to about 30 megahertz, thereby forming a first vapor;
    (f) providing a nickel-containing substrate disposed outside of said reactor, wherein said substrate is comprised of at least 40 mole percent of nickel;
    (g) contacting said first vapor with said substrate; thereby forming a coated nickel-containing substrate;
    (h) providing a second solution comprised of an yttrium compound, a barium compound, and a copper compound, wherein said yttrium, said barium, and said copper are present in said solution in an atomic ratio of 1:2:3, and wherein said solution is comprised of from about 0.01 to about 1,000 grams of a mixture consisting essentially of said yttrium compound, said barrium compound, and said copper compound per liter of said second solution;
    (i) subjecting said second solution to ultrasonic sound waves at a frequency in excess of 20.000 hertz, and to a substantially atmospheric pressure of at least about 600 millimeters of mercury, thereby causing said second solution to form into a second aerosol;
    (j) providing a radio frequency plasma reactor;
    (k) generating a plasma gas within said radio frequency plasma reactor;
    (l) contacting said second aerosol with said plasma gas within said plasma reactor of step (k) while subjecting said second aerosol to a substantially atmospheric pressure of at least about 600 millimeters of mercury and to a radio frequency alternating current at a frequency of from about 100 kilohertz to about 30 megahertz, thereby forming a second vapor; and
    (m) contacting said second vapor with said coated substrate while said coated substrate is disposed outside of said plasma reactor of step (k), thereby forming an electronic cell.

2. The process as recited in claim 1, wherein said substrate consists essentially of nickel.

3. The process as recited in claim 1, wherein said first compound is an yttrium compound.

4. The process as recited in claim 1, wherein said first compound is a calcium compound.

5. The process as recited in claim 1, wherein said first compound is a mixture of an yttrium compound and a calcium compound.

6. The process as recited in claim 1 wherein said electronic cell is formed into the shape of tube.

7. The process as recited in claim 6, wherein said tube is subjected to a heat treatment at a temperature of from about 900 to about 1,000 degrees centigrade for at least about 30 minutes.

8. The process as recited in claim 7, wherein said nickel-containing substrate consists essentially of a nickel-containing alloy.

9. The process as recited in claim 8, wherein said alloy is comprised of molybdenum.

10. The process as recited in claim 9, wherein said alloy is comprised of chromium.

* * * * *